(12) United States Patent
Yang et al.

(10) Patent No.: US 8,518,832 B1
(45) Date of Patent: Aug. 27, 2013

(54) PROCESS FOR MASKING AND REMOVAL OF RESIDUE FROM COMPLEX SHAPES

(75) Inventors: Xiaoyu Yang, Union City, CA (US); Xianzhong Zeng, Fremont, CA (US); Yan Chen, Fremont, CA (US); Yunhe Huang, Pleasanton, CA (US); Jinqiu Zhang, Fremont, CA (US); Yang Xiang, Fremont, CA (US); Ching-Huang Lu, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 63 days.

(21) Appl. No.: 13/169,588

(22) Filed: Jun. 27, 2011

(51) Int. Cl.
*H01L 21/311* (2006.01)
*H01L 21/461* (2006.01)

(52) U.S. Cl.
USPC ............ 438/706; 438/707; 438/710; 438/725

(58) Field of Classification Search
None
See application file for complete search history.

(56) References Cited

U.S. PATENT DOCUMENTS

| | | | |
|---|---|---|---|
| 4,529,860 A | | 7/1985 | Robb |
| 5,010,378 A | * | 4/1991 | Douglas ........................ 257/301 |
| 5,173,442 A | * | 12/1992 | Carey .............................. 216/18 |
| 5,328,810 A | * | 7/1994 | Lowrey et al. ................. 430/313 |
| 5,562,801 A | * | 10/1996 | Nulty ............................. 438/695 |
| 5,661,083 A | | 8/1997 | Chen et al. |
| 5,798,303 A | | 8/1998 | Clampitt |
| 5,994,226 A | | 11/1999 | Kadomura |
| 6,309,976 B1 | | 10/2001 | Lin et al. |
| 6,649,531 B2 | | 11/2003 | Cote et al. |
| 6,787,475 B2 | | 9/2004 | Wang et al. |
| 6,951,823 B2 | | 10/2005 | Waldfried et al. |
| 6,984,585 B2 | | 1/2006 | Ying et al. |
| 7,253,115 B2 | | 8/2007 | Tanaka et al. |
| 7,265,060 B2 | | 9/2007 | Tsai et al. |
| 7,297,638 B2 | | 11/2007 | An et al. |
| 7,371,507 B2 | | 5/2008 | Myung |
| 7,390,753 B2 | | 6/2008 | Lin et al. |
| 7,547,669 B2 | | 6/2009 | Lee |
| 7,674,755 B2 | | 3/2010 | Egbe et al. |
| 7,700,533 B2 | | 4/2010 | Egbe et al. |
| 7,718,543 B2 | | 5/2010 | Huang et al. |
| 2003/0100190 A1 | | 5/2003 | Cote et al. |
| 2004/0214448 A1 | | 10/2004 | Chan et al. |
| 2009/0029557 A1 | | 1/2009 | Kikuchi et al. |
| 2009/0173977 A1 | | 7/2009 | Xiao et al. |
| 2009/0192065 A1 | | 7/2009 | Korzenski et al. |

\* cited by examiner

*Primary Examiner* — Duy Deo

(57) ABSTRACT

A process is provided for etching a mask layer and removal of residue from a structure having an area sheltered from directional etching. The structure has a shape that forms a silhouette area obstructed from being etched by anisotropic bombardment originating from a first direction, and a mask formed over the mask layer over the structure; A first etch process removes at least a part of the mask layer and retains at least a part of mask layer in the sheltered area. A second etch process removes at least a part of the mask layer in the sheltered area by hydrogen based microwave plasma etching.

20 Claims, 5 Drawing Sheets

500

PROCESS FOR MASKING AND REMOVAL OF RESIDUE FROM COMPLEX SHAPES

DETAILED DESCRIPTION OF THE EMBODIMENTS

Figure 1A:
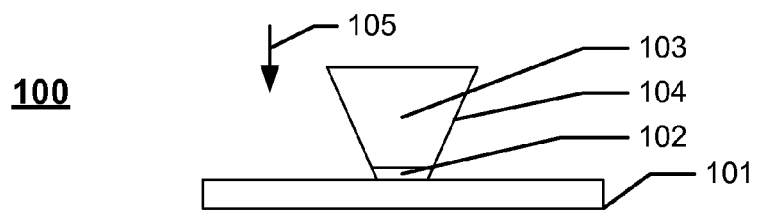
FIGS. 1a through 1f illustrate an approach for masking with a wet process.

FIG. 1 illustrates process 100 for providing a mask over a complex shape having a sheltered area. In process 100, a substrate 101 is provided. Substrate 101 may be any material suitable for the application. Substrate 101 may be, for example, a metal, semiconductor, or a dielectric material; and the invention scope is not limited by the material used. Shape 103 may be provided on optional interlayer 102. Shape 103 in process 100 is illustrated as a trapezoid with a top wider than the bottom, having the effect of casting a shadow or silhouette onto substrate 101 and/or the narrower under hanging side 104 of shape 103 when irradiated or exposed to light from an overhead direction 105. The shape 103 is one example of a shape that will have shadowing from directional exposure. A cantilever with a top structure overhanging a supporting structure will also cause a silhouette underneath the cantilever when exposed from above. Another example of a cantilever may be an overhanging shape that may be formed by etching under a feature, for example, to create a beam. Shape 103 may be of the same material as substrate 101 or a different material. Substrate 101, optional interlayer 102, and shape 103 may be any suitable material, or comprise layers of material, and the invention is not limited by the materials used.

Figure 1B:
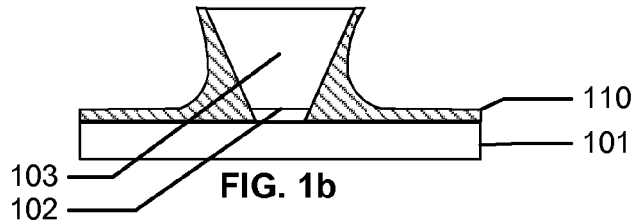

FIG. 1b illustrates substrate 101, optional interlayer 102, and shape 103. A developable bottom anti-reflective coating (DBARC) 110 may be applied over substrate 101. DBARC 110 may comprise soluble organic material. DBARC 110 may be applied over substrate 110 by spin coating. Spin coating may also result in DBARC 110 coating the sides of shape 103. DBARC 110 may be used to facilitate the photolithographic process and prevent unwanted reflections under exposure to light for patterning. DBARC 110 may be developable or etchable by the same solvents used to develop or etch photoresist, thereby providing a simplified process.

Figure 1C:
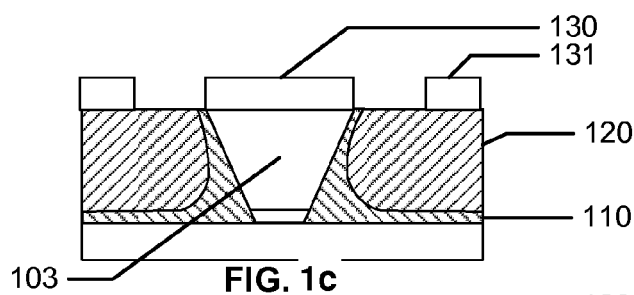

FIG. 1c illustrates the application and masking of photoresist 120 onto DBARC 110 and shape 103. Photoresist 120 may be of any suitable material; and materials and application are well known in the art. Pattern masks 130 and 131 are provided over photoresist 120 and shape 103 using any suitable process, and many such processes are known in the art. Exposure of photoresist 120 may be from irradiation above the pattern mask 130 and 131.

Figure 1D:
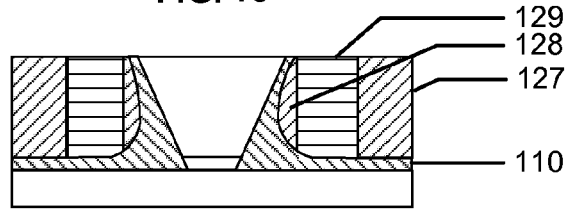

FIG. 1d illustrates exposed photoresist 129 and unexposed photoresist pattern 127; and unexposed sheltered photoresist 128. Due to the highly directional exposure of the photoresist, sheltered photoresist 128 will not be exposed from the irradiation from above.

Figure 1E:
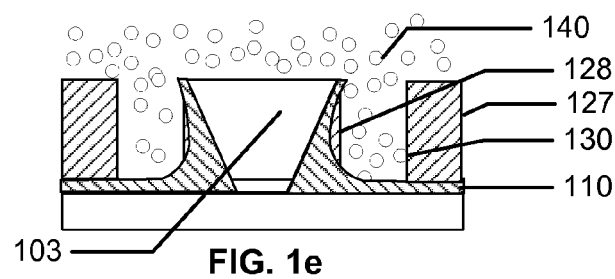

FIG. 1e illustrates removal of exposed photoresist 129 by immersion in wet solvent 140, shown by bubbles. Exposed photoresist 129 may be easily removed by wet solvent 140, leaving photoresist pattern 127, photoresist pattern side wall 130, sheltered photoresist 128 and DBARC 110; although a portion of DBARC 110 may also be removed in this step.

Exposed photoresist 129 may dissolve readily in an appropriate solvent. Unexposed photoresist is also soluble in developer, however, at a much slower rate. FIG. 1e illustrates a condition where the easily dissolved photoresist has been removed and the unexposed photoresist is largely unaffected. For some applications, this step may be end of the mask process; however, some applications may require the removal of the sheltered photoresist 128 and DBARC 110 from shape 103. In one example, it may be desired to apply a material in direct contact with shape 103, necessitating the removal of sheltered photoresist 128 and DBARC 110

Figure 1F:
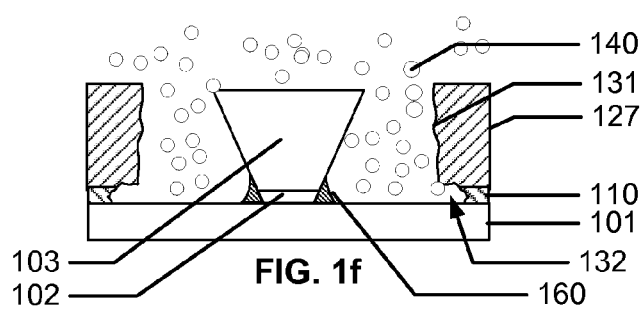

FIG. 1f illustrates a continuation of immersion in wet solvent 140. As noted above, wet solvent 140 may dissolve unexposed photoresist, however at a slow rate. In this approach, immersion in wet solvent 140 may continue until sheltered photoresist 128 is fully dissolved. In this approach, DBARC 110 is also soluble in wet solvent 140, and is also removed. A portion of DBARC 110 or sheltered photoresist 128 is shown as residue 160 at the bottom of shape 103. Residue 160 may be removed completely by continued immersion in wet solvent 140. Photoresist pattern 127 was also partly dissolved by the continued immersion; however, may retain a controlled side wall 131. This loss of photoresist from side wall 131 from original position shown in side wall 127 in FIG. 1e to final position shown in side wall 131 in FIG. 1f may be compensated for in the original mask. In some applications, photoresist may follow a profile from underlying features, and may follow the underlying profile when etched. Critical dimensions may be compensated for in the original photo mask. Photoresist height may also be etched, and may be compensated for in increased thickness as needed.

DBARC 110 may not dissolve at the same rate as the photoresist pattern 127. If DBARC 110 dissolves at a faster rate than photoresist pattern 127, an undercut 132 may result. In some applications, undercut 132 may be detrimental and render process 100 less effective. Undercut 132 may result in voids when a subsequent material is deposited into the pattern between shape 103 and photoresist pattern 127. Undercut 132 may also result in an undesirable shape above substrate 101 if any deposited material fills into the undercut 132.

Figure 2:
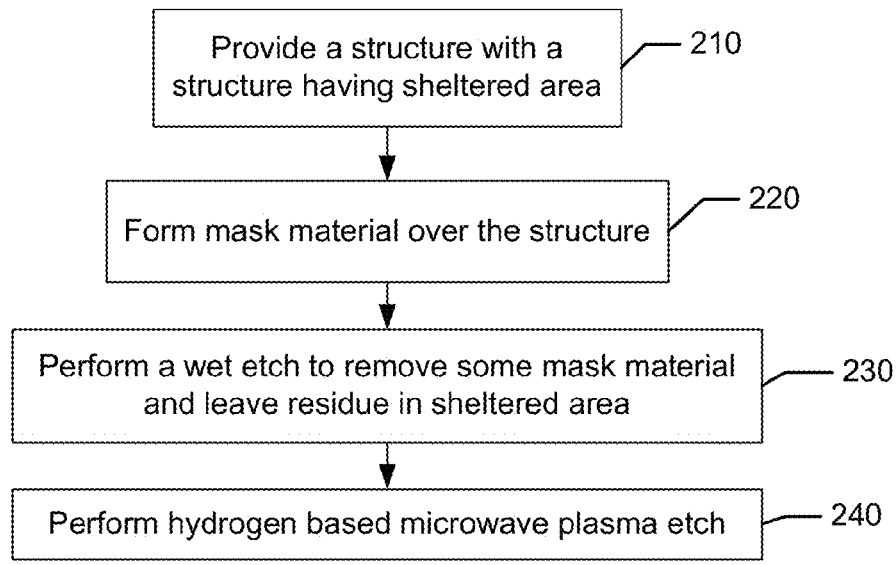
FIG. 2 is a flow chart illustrating a process for masking complex shapes using wet etch and plasma etch according to one embodiment of the invention.

FIG. 2 is a flow chart illustrating process 200 for masking complex shapes using wet etch and plasma etch according to an embodiment of the invention. Starting in block 220, a structure is provided that has a shape that has a top part that shelters a bottom part as described in the description for FIG. 1a. The structure may be a trapezoid as shown in shape 103 in FIG. 1a, or any other shape that shelters any underlying area from angle incident bombardment from any single angle. In block 210, an organic photoresist is provided on the structure; a mask is provided over the photoresist and then exposed to form a developable photoresist pattern. A DBARC may be provided on the structure prior to depositing the organic photoresist. The organic photoresist and/or DBARC may contain hydrocarbons. In block 230, a wet etch is performed to remove the lithographically exposed photoresist. The wet etching process is stopped prior to removing all the exposed or unexposed photoresist from the sheltered area, leaving a residue. In one embodiment, all of the exposed photoresist is removed by wet etching; and in another embodiment, some exposed photoresist remains when wet etching is stopped. In one embodiment, wet etching is stopped before an underlayer is exposed. In a further embodiment, wet etching is stopped before an underlayer under the developable photoresist pattern is exposed. In block 240, hydrogen based microwave plasma etching is performed until the organic photoresist residue is removed from the sheltered area.

Conventional inductively coupled plasma etching or ion beam etching is anisotropic. Etching is performed by ion bombardment in a process that has been compared to sand blasting. In some conventional plasma etching systems, ions are exited between inductively coupled parallel plates and bombard a target from a single direction. For many applications, this is very desirable, and may provide excellent mask etching with well controlled vertical side walls; thereby providing sharp masks without undercutting. This attribute of inductively coupled plasma etching has a disadvantage when material to be removed is not accessible from a direction perpendicular between the parallel plates. In some instances, the target being etched may be tilted to provide line-of-sight access to the ion bombardment for etching. This may be very cumbersome and time consuming if complex shapes are involved; and many angles of incidence may be required. Some shapes, for example cantilevers or beams, may not be accessible to ion bombardment from any accessible direction.

Microwave plasma, however, operates on a different principle and excites the plasma ions in an isotropic manner. Material is removed from surfaces uniformly and line-of-sight access is not required.

Microwave plasma etching that is hydrogen based is particularly useful for removing organic photoresist and DBARC. The wet etching process can remove large areas of photoresist very efficiently, but may have detrimental effects when removing photoresist in sheltered areas. Wet etching is isotropic, that is, it etches in all directions equally. By performing a wet etch and stopping prior to removing all the photoresist from the sheltered areas, problems such as undercutting and undesired residue can be avoided. Due to the nature of microwave plasma etching, an isotropic etching occurs. Etching occurs in all directions uniformly. Photoresist and DBARC compositions may be chosen to have properties that etch uniformly by microwave plasma etching, and hydrogen based plasma is effective in etching organic photoresist and DBARC. Mask patterns therefore may preserve the sharp vertical walls provided by developing photoresist. In one embodiment of process 200, the hydrogen based plasma comprises $CH_3OH$. In a further embodiment, the $CH_3OH$ ion density may be greater than $0.5 \times 10^{12}$ per $cm^3$, and gas pressure between 75 mTorr and 750 mTorr. In another embodiment, the gas flow rate may be between 80 ml/minute and 200 ml/minute. In another embodiment, the plasma temperature may be between 80° C. and 150° C., and in a further embodiment, the microwave power may be between 100 and 1000 watts.

In one embodiment of process 200, the hydrogen based plasma comprises a mixture of hydrogen and nitrogen. In a further embodiment, the $N_2/H_2$ ion density may be greater than $0.5 \times 10^{12}$ per $cm^3$, and gas pressure between 75 mTorr and 750 mTorr.

In another embodiment, the gas flow rate may be between 80 ml/minute and 200 ml/minute. In another embodiment, the plasma temperature may be between 80° C. and 150° C., and in a further embodiment, the microwave power may be between 100 and 1000 watts.

Figure 3:
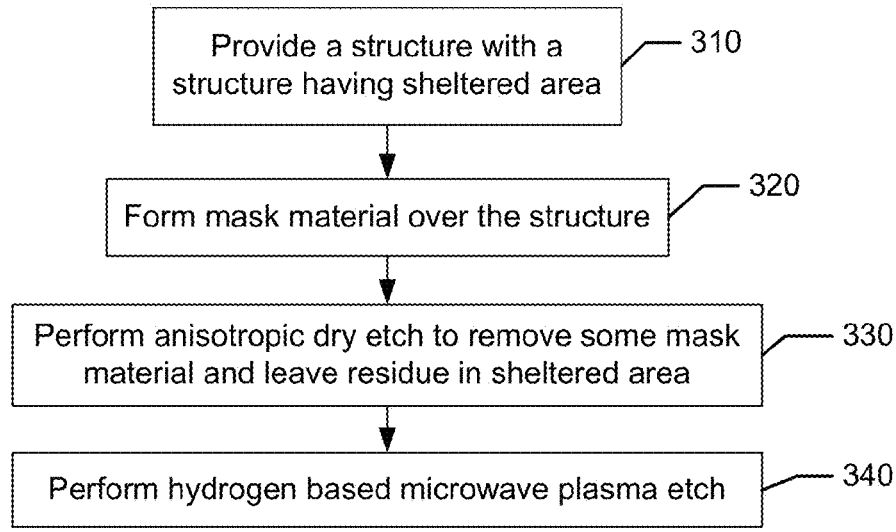
FIG. 3 is a flow chart illustrating a process for masking complex shapes using dry etch according to one embodiment of the invention.

For some applications, wet etching may be undesirable. Wet etching may not be compatible with the chemistry of the materials used, possibly leading to corrosion or chemical reactions. Wet etching may also be undesirable due to process limitations. FIG. 3 is a flow chart illustrating process 300 for masking complex shapes using anisotropic dry etch and hydrogen based microwave plasma etch according to an embodiment of the invention.

In FIG. 3, process 300 starts in block 310, a structure is provided that has a shape that has a top part that shelters a bottom part as described in the description above describing FIG. 1a. The structure may be a trapezoid as shown in shape 103 in FIG. 1a, or any other shape that shelters any underlying area from angle incident bombardment from any single angle. In block 320, an organic photoresist is provided on the structure; a mask is provided over the photoresist and then exposed to form a developable photoresist pattern. A DBARC may be provided on the structure prior to depositing the organic photoresist. The organic photoresist and/or DBARC may contain hydrocarbons. In block 330, anisotropic plasma etching is performed to remove the lithographically exposed photoresist. The anisotropic dry etching may be performed using inductively coupled plasma etching. The anisotropic plasma etch process may be stopped prior to removing all of the exposed or unexposed photoresist from the sheltered area, leaving a residue. In one embodiment, all of the exposed photoresist may be removed by anisotropic plasma etching; and in another embodiment, some exposed photoresist remains when anisotropic plasma etching is stopped. In one embodiment, anisotropic plasma etching may be stopped before an underlayer is exposed. In a further embodiment, anisotropic plasma etching may be stopped before an underlayer under the developable photoresist pattern is exposed. In block 340, hydrogen based microwave plasma etching is performed until the remaining organic photoresist residue is removed from the sheltered area In one embodiment of process 300, the hydrogen based plasma comprises $CH_3OH$. In a further embodiment, the $CH_3OH$ ion density may be greater than $0.5 \times 10^{12}$ per $cm^3$, and gas pressure between 75 mTorr and 750 mTorr. In another embodiment, the gas flow rate may be between 80 ml/minute and 200 ml/minute. In another embodiment, the plasma temperature may be between 80° C. and 150° C., and in a further embodiment, the microwave power may be between 100 and 1000 watts.

In one embodiment of process 300, the hydrogen based plasma comprises a mixture of hydrogen and nitrogen. In a further embodiment, the $N_2/H_2$ ion density may be greater than $0.5 \times 10^{12}$ per $cm^3$, and gas pressure between 75 mTorr and 750 mTorr. In another embodiment, the gas flow rate may be between 80 ml/minute and 200 ml/minute. In another embodiment, the plasma temperature may be between 80° C. and 150° C., and in a further embodiment, the microwave power may be between 100 and 1000 watts.

FIGS. 4a through 4f illustrate process 400 using wet etching and microwave plasma etching for masking complex shapes according to one embodiment of the invention.

Figure 4A:
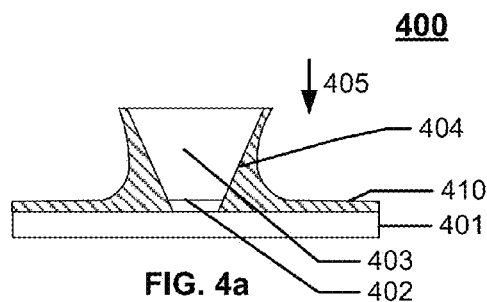
FIGS. 4a through 4f illustrate using wet etch and plasma etch in a process for masking complex shapes according to one embodiment of the invention.

In FIG. 4a, a substrate 401 is provided. Substrate 401 may be any material suitable for the intended application. Substrate 401 may be, for example, a metal, semiconductor, or a dielectric material; and the invention scope is not limited by the material used. Shape 403 is provided on optional interlayer 402. Shape 403 in process 400 is illustrated as a trapezoid with a top wider than the bottom, having the effect of casting a shadow or silhouette onto substrate 401 and/or the narrower under hanging side portion 404 of trapezoid 403 when irradiated or exposed to light from an overhead direction 405. The trapezoid 403 is one example of a shape that will have shadowing from directional exposure. A cantilever with a top structure overhanging a supporting structure will also cause a silhouette underneath the cantilever when exposed from above. Another example of a cantilever is an overhanging shape that may be formed by etching under a feature, for example, to create a beam. Shape 403 may be on top of optional interlayer 402. Shape 403 may be of the same material as substrate 401 or a different material. Substrate 401, optional interlayer 402, and shape 403 may be any suitable material, or comprise layers of material; and the invention is not limited by the materials used.

FIG. 4a also illustrates DBARC 410 applied over substrate 401. DBARC 410 may comprise soluble organic material. DBARC 410 may be applied over substrate 410 by spin coating. Spin coating may also result in DBARC 410 coating the sides of shape 403. DBARC 410 may be used to facilitate the photolithographic process and prevent unwanted reflections when exposed when exposed to light for patterning. DBARC 410 may be developable or etchable by the same solvents used to develop or etch photoresist, thereby providing a simplified process.

Figure 4D:
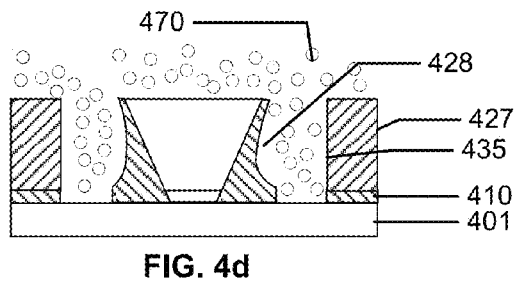
Figure 4B:
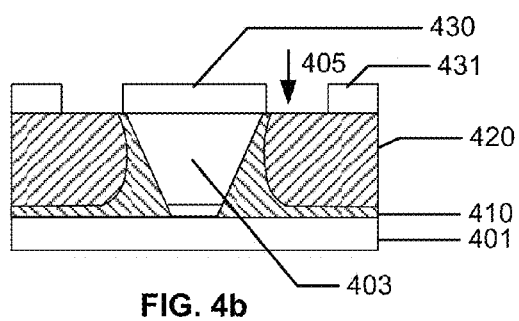

FIG. 4b illustrates the application and masking of photoresist 420 onto DBARC 410 and shape 403. Organic photoresist 420 may be of any suitable material; and materials and application is well known in the art. Pattern mask 430 and 431 are provided over photoresist 420 and shape 403 using any suitable process, and many such processes are known in the art. Exposure of the photoresist 420 may be from irradiation direction 405 above the pattern masks 430 and 431.

Figure 4E:
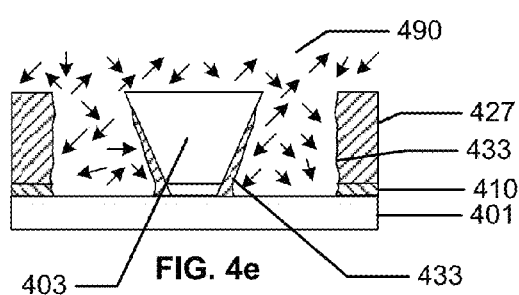
Figure 4C:
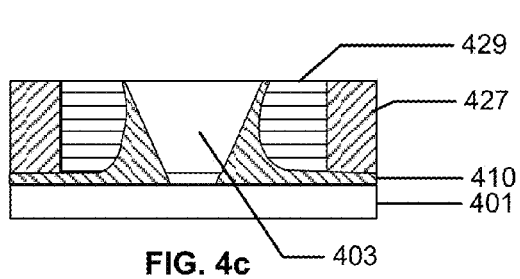

FIG. 4c illustrates substrate 401, DBARC 410, exposed photoresist 429 and unexposed photoresist pattern 427. Unexposed photoresist may also occur on the sides of shape 403 as described in process 100, shown in FIG. 1d and described in accompanying descriptions.

FIG. 4d illustrates removal of the exposed photoresist 429 of FIG. 4c by immersion in wet solvent 470, shown by bubbles. Exposed photoresist 429 of FIG. 4c may be easily removed by wet solvent 470, leaving photoresist pattern 427, photoresist pattern side wall 435, and remaining portions of DBARC 428; although a portion of DBARC 428 may also be removed in this step. In one embodiment a large portion of DBARC 428 may be removed by extending the wet etch process, leaving enough residue to ensure that over etching does not result in undercutting as shown in 132 of FIG. 1f. DBARC 428 may also have undeveloped photoresist residue remaining when the wet etching process is stopped.

FIG. 4e illustrates a dry process after wet etching as described in FIG. 4d has been terminated. In FIG. 4e a hydrogen based microwave plasma 490, illustrated by random arrows, is applied to remove the remaining residue. Photoresist pattern side wall 435, shown in FIG. 4d, may be substantially perpendicular after the wet etching process, and remain substantially perpendicular after hydrogen based microwave plasma etching. Photoresist side wall pattern 4233 may be removed uniformly from photoresist pattern 427, including the underlying DBARC 410. Residue 433 will be removed from the side of shape 403, and the hydrogen based microwave plasma etching may continue until residue 433 is removed.

Figure 4F:
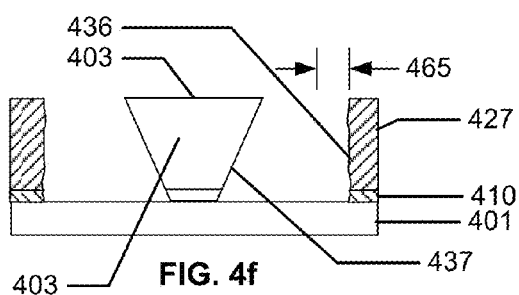

FIG. 4f illustrates shape 403 with residue 433 in FIG. 4e removed from sheltered side 437. Any remaining photoresist residue or DBARC residue may be also removed from substrate 401. Photoresist pattern 427 and underlying DBARC 410 have also been partially etched by the hydrogen based plasma etching. Photoresist pattern 427 and DBARC 410 have been etched from their original location illustrated by photoresist pattern side wall 435 in FIG. 4d, to location 436 by amount 465 in FIG. 4f. This erosion in the original photoresist side wall 427 due to hydrogen based microwave plasma etching may be compensated in the mask pattern so that the final mask is at the desired location.

FIGS. 5a through 5f illustrate process 500 using dry etch in a process for masking complex shapes according to one embodiment of the invention.

Figure 5A:
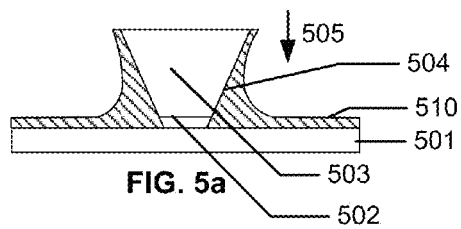
FIGS. 5a through 5f illustrate using dry etch in a process for masking complex shapes according to one embodiment of the invention.

In FIG. 5a, a substrate 501 is provided. Substrate 501 may be any material suitable for the application. Substrate 501 may be, for example, a metal, semiconductor, or a dielectric material, and the invention scope is not limited by the material used. Shape 503 may be provided on optional interlayer 502. Shape 503 in process 500 is illustrated as a trapezoid with a top wider than the bottom, having the effect of casting a shadow or silhouette onto the substrate 501 and/or the narrower under hanging side portion 504 of trapezoid 503 when irradiated or exposed to light from an overhead direction 505. Trapezoid 503 is one example of a shape that will have shadowing from directional exposure. A cantilever with a top structure overhanging a supporting structure will also cause a silhouette underneath the cantilever when exposed from above. Another example of a cantilever may be an overhanging shape that may be formed by etching under a feature, for example, to create a beam. Shape 503 may be on top of optional interlayer 502. Shape 503 may be of the same material as substrate 501 or a different material. Substrate 501, optional interlayer 502, and shape 503 may be any suitable material, or comprise layers of material; and the invention is not limited by the materials used.

FIG. 5a also illustrates DBARC 510 applied over substrate 501. DBARC 510 may comprise soluble organic material. DBARC 510 may be applied over substrate 510 by spin coating. Spin coating may also result in DBARC 510 coating the sides of shape 503. DBARC 510 may be used to facilitate the photolithographic process and prevent unwanted reflections when exposed when exposed to light for patterning. DBARC 510 may be developable or etchable by the same solvents used to develop or etch photoresist, thereby providing a simplified process.

Figure 5B:
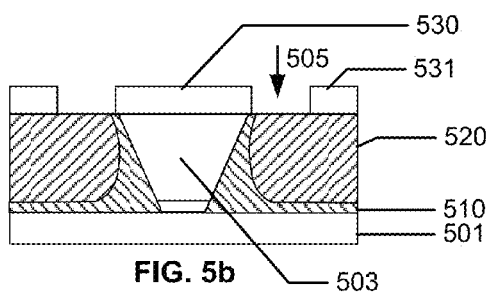

FIG. 5b illustrates the application and masking of photoresist 520 onto DBARC 510 and shape 503. Organic photoresist 520 may be of any suitable material; and materials and application is well known in the art. Pattern mask 530 and 531 are provided over photoresist 520 and shape 503 using any suitable process, and many such processes are known in the art. Lithographic exposure of photoresist 520 may be from direction 505 above the pattern masks 530 and 531.

Figure 5C:
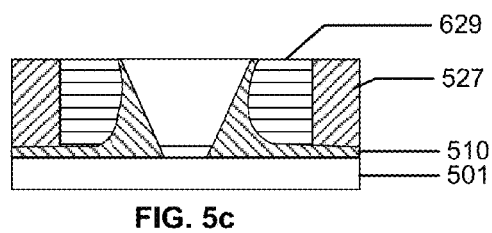

FIG. 5c illustrates substrate 501, DBARC 510, exposed photoresist 529 and unexposed photoresist pattern 527. Unexposed photoresist may also occur on the sides of shape 503 as described in process 100; and shown in FIG. 1d and described in accompanying descriptions.

Figure 5D:
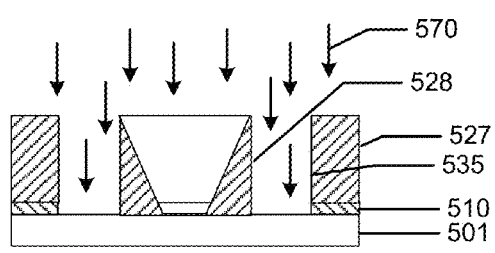

FIG. 5d illustrates removal of the exposed photoresist 529 of FIG. 5c by anisotropic plasma etching 570, illustrated by arrows in a uniform direction. Exposed photoresist 529 of FIG. 5c may be easily removed by anisotropic etching 570, leaving photoresist pattern 527, photoresist pattern side wall 535, and DBARC 528; although a portion of DBARC 528 may also be removed in this step. Unexposed photoresist residue overlaying DBARC 528 may also be present in the sheltered area as described in process 100 FIG. 1d and accompanying descriptions.

Figure 5E:
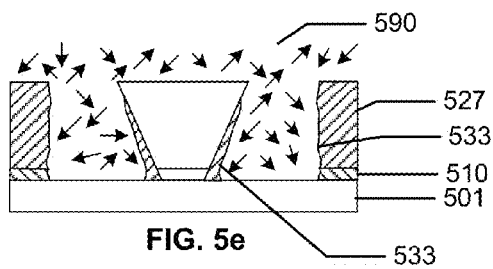

In FIG. 5e, hydrogen based microwave plasma 590, illustrated by random arrows, is applied to remove residue 533 that remains on the sheltered area of shape 503. Photoresist pattern side wall 535 may be substantially perpendicular anisotropic plasma etching process, and remain substantially perpendicular after hydrogen based microwave plasma etching. Photoresist pattern 527 may be removed uniformly from the photoresist side wall 533, including the underlying DBARC 510. Residue 533 will also be removed from the side of shape 503, and the hydrogen based microwave plasma etching may continue until residue 533 is removed.

Figure 5F:
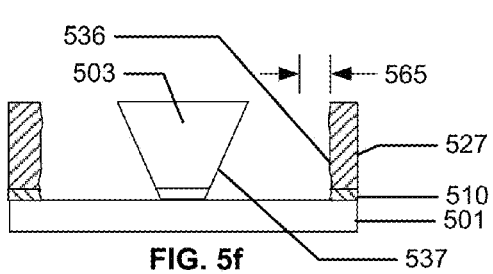

FIG. 5f illustrates shape 503 with residue 533 removed from sheltered side 537. Any remaining photoresist residue or DBARC residue is also removed from substrate 501. Photoresist pattern 527; and underlying DBARC 510 have been partially removed by the hydrogen based plasma etching. Photoresist pattern 527 and DBARC 510 have been etched from their original location illustrated by photoresist pattern side wall 535 in FIG. 5d, to location 537 by amount 565 in FIG. 5f. This erosion in the original photoresist side wall 527 due to hydrogen based microwave plasma etching may be compensated in the mask pattern so that the final mask is at the desired location.

FIGS. 6a through 6e illustrate process 600 using a dry etch process for masking a complex shape according to one embodiment of the invention.

Figure 6A:
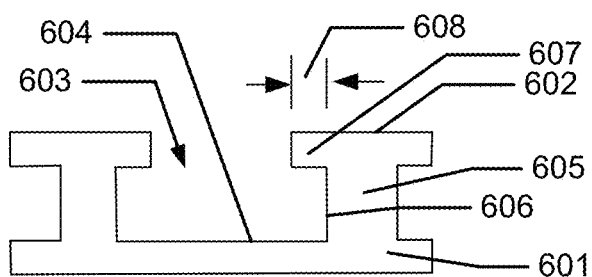
FIGS. 6a through 6e illustrate using a dry etch process for masking a complex shape according to one embodiment of the invention.

FIG. 6a illustrates structure 601 with top surface 602, trench 603, bottom 604, support 605, side wall 606, cantilever 607, and overhang 608.

Figure 6B:
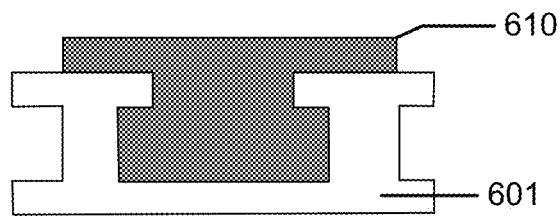
Figure 6C:
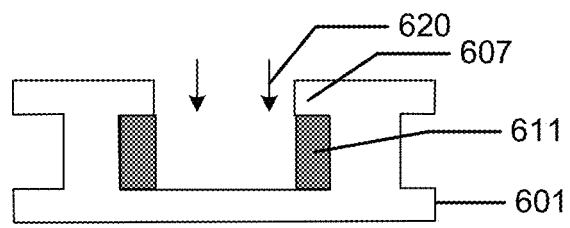

FIG. 6b illustrates photoresist mask 610 applied on structure 601. Photoresist mask may be applied to facilitate other operations in the process, for example to form structures for deposition, etching, plating, or sputtering operations; and some or all of the mask may be removed at a later operation. Photoresist 610 may be applied in a fluid state and may fill in trenches or voids. One method of applying photoresist may be by spin coating.

FIG. 6b shows removal of unwanted photoresist by anisotropic plasma etching from direction 620. Anisotropic etching, for example by using an inductively coupled plasma source, is highly directional and will not etch around obstructions. Area 611 under cantilever 607 is sheltered from anisotropic plasma direction 620 and will not be etched away. Anisotropic etching is capable of etching large areas efficiently and may provide a highly productive first etching process on complex shapes.

Figure 6D:
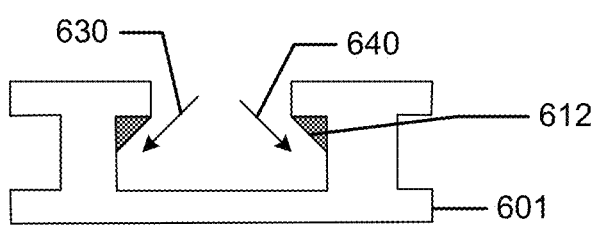

FIG. 6d illustrates first angle incident anisotropic plasma etching 630 and second angle incident anisotropic plasma etching 640. Angle incident etching is known in the art and can remove material from surfaces not accessible from any single direction; however, structure 601 has surfaces that cannot be etched from any combination of angles. Residue 612 cannot be etched by anisotropic etching from any combination of angles that are accessible from an anisotropic ion source.

Figure 6E:
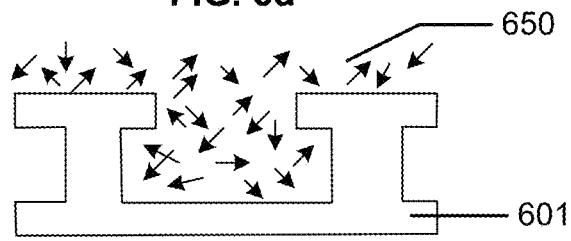

FIG. 6e illustrates removal of residue 612 from structure 601 using hydrogen based microwave plasma etching 650, illustrated by random arrows.

Although the foregoing has been described in terms of certain embodiments, other embodiments will be apparent to those of ordinary skill in the art from the disclosure herein. Figures are illustrative and not drawn to scale. For example; proximity between structures such as trenches, side walls, top and bottom surfaces are illustrated compactly for clarity, but may be separated by much larger distances. Structures shown as solids may employ gradients, layers; or may have seed layers, interlayers, or laminations. Common operations that are known to those of ordinary skill in the art have been omitted or simplified in figures for clarity. The described embodiments have been presented by way of example only and are not intended to limit the scope of the disclosure. Indeed, the novel methods and systems described herein may be embodied in a variety of other forms without departing from the spirit thereof. Thus, the invention is not limited by any preferred embodiments, but is defined by reference to the appended claims.

We claim:

1. A process for etching a mask layer and removal of residue from a structure having an area sheltered from directional etching, comprising:
   providing the structure comprising a shape;
   the shape forming a silhouette area obstructed from being etched by anisotropic bombardment originating from a first direction;
   forming the mask layer over the structure;
   performing a first etch process to remove at least a part of the mask layer and retain at least a part of mask layer in the sheltered area, and
   performing a second etch process to remove at least a part of the mask layer in the sheltered area by hydrogen based microwave plasma etching.

2. The process of claim 1 wherein the structure comprises a cantilever, the cantilever comprising a top and a support; wherein the top overhangs the support.

3. The process of claim 1 wherein the structure comprises
   a substrate with a top surface;
   a trench in the top surface, the trench further comprising a side wall and a bottom, wherein
   the top surface overhangs at least one of the side wall and the bottom.

4. The process of claim 1 wherein the structure comprises a trapezoid with a top and a bottom, wherein the top is wider than the bottom.

5. The process of claim 1 wherein the first etch process comprises a wet etch.

6. The process of claim 5 wherein the wet etch process comprises a photoresist developer.

7. The process of claim 1 wherein the first etch process comprises an anisotropic dry etch.

8. The process of claim 7 wherein the anisotropic dry etch comprises inductively coupled plasma etching.

9. The process of claim 1 wherein the mask layer further comprises:
   a antireflective layer deposited on the structure, and
   photoresist deposited on the antireflective layer.

10. The process of claim 1, wherein the mask layer comprises at least one of the following:
    an organic photoresist;
    a hydrocarbon, and
    a Developable Bottom Anti-Reflection Coating (DBARC).

11. The process of claim 1 wherein the hydrogen based plasma comprises $CH_3OH$.

12. The process of claim 11 further comprising:
    $CH_3OH$ ion density greater than $0.5 \times 10^{12}$ per $cm^3$, and a gas pressure between 75 mTorr and 750 mTorr.

13. The process of claim 12 further comprising a gas flow rate between 80 ml/minute and 200 ml/minute.

14. The process of claim 12 further comprising a plasma temperature between 80° C. and 150° C.

15. The process of claim 12 further comprising a microwave power between 100 and 1000 watts.

16. The process of claim 1 wherein the hydrogen based microwave plasma comprises a mixture of nitrogen and hydrogen.

17. The process of claim 16 further comprising: $N_2/H_2$ ion density greater than $0.5\times10^{12}$ per $cm^3$, and a gas pressure between 75 mTorr and 750 mTorr.

18. The process of claim 17 further comprising a gas flow rate between 80 ml/minute and 200 ml/minute.

19. The process of claim 17 further comprising a plasma temperature between 80° C. and 150° C.

20. The process of claim 17 further comprising a microwave power between 100 and 1000 watts.

* * * * *